US009754931B2

(12) United States Patent
Jeon et al.

(10) Patent No.: US 9,754,931 B2
(45) Date of Patent: Sep. 5, 2017

(54) CIRCUIT AND AN INTEGRATED CIRCUIT INCLUDING A TRANSISTOR AND ANOTHER COMPONENT COUPLED THERETO

(71) Applicant: Semiconductor Components Industries, LLC, Phoenix, AZ (US)

(72) Inventors: Woochul Jeon, Phoenix, AZ (US); Joe Fulton, Phoenix, AZ (US); Chun-Li Liu, Scottsdale, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 14/808,627

(22) Filed: Jul. 24, 2015

(65) Prior Publication Data

US 2017/0025405 A1    Jan. 26, 2017

(51) Int. Cl.
*H01L 29/66* (2006.01)
*H01L 27/06* (2006.01)
*H01L 29/778* (2006.01)

(52) U.S. Cl.
CPC ........ *H01L 27/0629* (2013.01); *H01L 29/778* (2013.01)

(58) Field of Classification Search
CPC .............. H01L 27/0629; H01L 29/778; H01L 27/0262; G09G 3/282
See application file for complete search history.

(56) References Cited

U.S. PATENT DOCUMENTS

| 5,424,612 A * | 6/1995 | Kim ....................... G09G 3/282 |
| | | 315/169.1 |
| 2012/0235209 A1 | 9/2012 | Briere et al. |
| 2013/0009165 A1 | 1/2013 | Park et al. |
| 2013/0088280 A1 | 4/2013 | Lal et al. |
| 2013/0120049 A1* | 5/2013 | Galy ..................... H03K 17/063 |
| | | 327/446 |
| 2013/0320354 A1 | 12/2013 | Treu et al. |
| 2014/0021511 A1 | 1/2014 | Jeon et al. |
| 2014/0091311 A1 | 4/2014 | Jeon et al. |
| 2014/0375372 A1* | 12/2014 | Ikeda ..................... H03K 17/74 |
| | | 327/333 |

* cited by examiner

*Primary Examiner* — Thanh Y Tran
(74) *Attorney, Agent, or Firm* — Abel Law Group, LLP

(57) ABSTRACT

A circuit can include a transistor coupled to a resistor or a diode. In an embodiment, the circuit can include a pair of transistors arranged in a cascode configuration, and each of the transistors can have a corresponding component connected in parallel. In a particular embodiment, the components can be resistors, and in another particular, embodiment, the components can be diodes. The circuit can have less on-state resistance as compared to a circuit in which only one of the components is used, and reduces the off-state voltage on the gate of a high-side transistor. An integrated circuit can include a high electron mobility transistor structure and a resistor, a diode, a pair of resistors, or a pair of diodes.

20 Claims, 7 Drawing Sheets

CIRCUIT AND AN INTEGRATED CIRCUIT INCLUDING A TRANSISTOR AND ANOTHER COMPONENT COUPLED THERETO

FIELD OF THE DISCLOSURE

The present disclosure relates to circuits and integrated circuits, and in particular, circuits and integrated circuits that include transistors and components coupled to such transistors.

RELATED ART

A cascode arrangement can include a high-side transistor, which can be a depletion mode high electron mobility transistor, and a low side transistor, which can be an enhancement mode Si metal-oxide-semiconductor field-effect transistor (MOSFET), that are connected to each other at a middle node. The gate electrode of the high-side transistor is electrically connected to the source of the low-side transistor. During a cut-off operation, the Si MOSFET can get into its avalanche region because the voltage of the middle node (Vm) can exceed the drain-to-source breakdown voltage of the Si MOSFET. High stress to the gate of the high electron mobility transistor and a high likelihood of current collapse can result, and such stress and current collapse are particularly problematic for switching operations.

BRIEF DESCRIPTION OF THE DRAWINGS

Embodiments are illustrated by way of example and are not limited in the accompanying figures.

Figure 1:
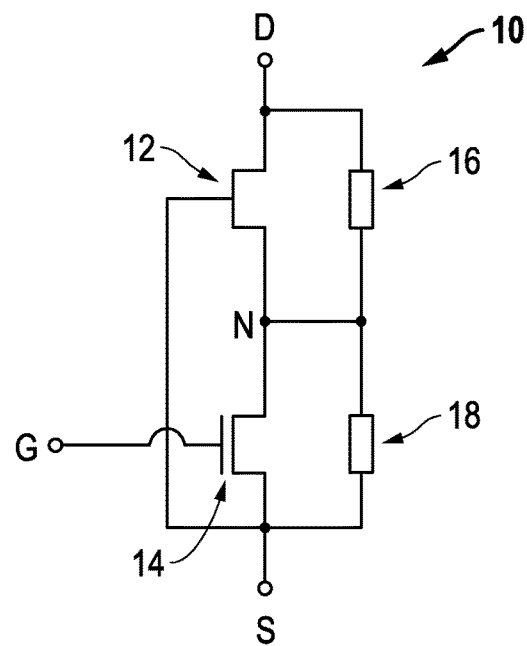
FIG. 1 includes a circuit diagram of transistors connected in a cascode arrangement with components connected in parallel with their corresponding transistors.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other embodiments can be used based on the teachings as disclosed in this application.

The term "effective resistance" is intended to mean the resistance of a resistor or the resistance of a reversed biased diode over a range of voltages higher (closer to zero) than its corresponding breakdown voltage.

The term "integrated circuit" is intended to mean at least two different electronic components formed within or over the same semiconductor substrate.

The term "transistor structure" is intended to mean a physical instantiation of a transistor. One transistor may have only one transistor structure or may have a plurality of transistors with their drain electrodes or collector electrodes connected together, their source electrodes or emitter electrodes connected together, and their gate electrodes or base electrodes connected together.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive- or and not to an exclusive- or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one, at least one, or the singular as also including the plural, or vice versa, unless it is clear that it is meant otherwise. For example, when a single item is described herein, more than one item may be used in place of a single item. Similarly, where more than one item is described herein, a single item may be substituted for that more than one item.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

A circuit can include a transistor coupled to a resistor or a diode. In an embodiment, the circuit can include a pair of transistors arranged in a cascode configuration, and each of the transistors can have a corresponding component connected in parallel. The components can be resistors or diodes. The components can help reduce the stress on the gate electrode of the high-side transistor, reduce the likelihood of current collapse, provide low on-state resistance ($R_{DSON}$), or any combination thereof. In particular, a component connected in parallel to the low-side transistor can provide a leakage path around the low-side transistor to help reduce the peak voltage at the control electrode of the high-side transistor. An embodiment in which both components are present help provide lower $R_{DSON}$ as compared to a circuit that only has one component in parallel with the low-side transistor.

At least part of the circuit can be in the form of an integrated circuit that can include a high electron mobility transistor structure and a resistor, a diode, a pair of resistors, or a pair of diodes. The integrated circuit can help reduce parasitic effects (parasitic resistance and inductance) that would otherwise occur with separate discrete components that are wired together.

FIG. 1 includes a circuit diagram of a circuit 10 that includes transistors 12 and 14 and components 16 and 18. The circuit 10 includes a pair of power supply terminals and an input or control terminal. The power supply terminal that is configured to receive the higher voltage is coupled to a current electrode of the transistor 12, and the other power supply terminal that is configured to receive the lower voltage is coupled to a current electrode of the transistor 14. The input or control terminal is coupled to a control electrode of the transistor 14.

The transistor 12 can include a High Electron Mobility Transistor (HEMT) that can generate a 2-Dimension Electron Gas (2DEG). The transistor 12 can include a III-V semiconductor material, and in an embodiment, the III-V semiconductor material is a III-N material, and in a more particular embodiment, the III-V semiconductor material is GaN or $Al_{(1-x)}Ga_xN$, where $0<x<1$. The transistor 12 can be a depletion mode transistor. A current electrode of the transistor 14 is coupled to a terminal of the circuit 10, and another current electrode of the transistor 12 is coupled to a middle node (N).

The transistor 14 can include an enhancement mode transistor. A current electrode of the transistor 14 can be coupled to a current electrode of the transistor 12 and the middle node, and another current electrode of the transistor 14 can be coupled to a control electrode of the transistor 12 and another terminal of the circuit 10. In an embodiment, the transistor 14 is an insulated gate field-effect transistor (IGFET). A current electrode of the transistor 14 is coupled to the middle node, and another electrode of the transistor 14 is coupled to another terminal of the circuit 10.

In an embodiment, the transistors 12 and 14 are field-effect transistors. In a particular embodiment, the drain of the transistor 12 is coupled to a drain terminal (D) of the circuit 10; the source of the transistor 12 is coupled to the middle node (N) and the drain of the transistor 14; the source of the transistor 14 is coupled to the gate of the transistor 12 and to a source terminal (S) of the circuit 10; and the gate of the transistor 14 is coupled to a control terminal (G) of the circuit 10, which can also be an input terminal for the circuit 10. Thus, the state of the circuit 10 can be controlled by controlling the voltage on the control terminal of the circuit 10.

Figure 2:
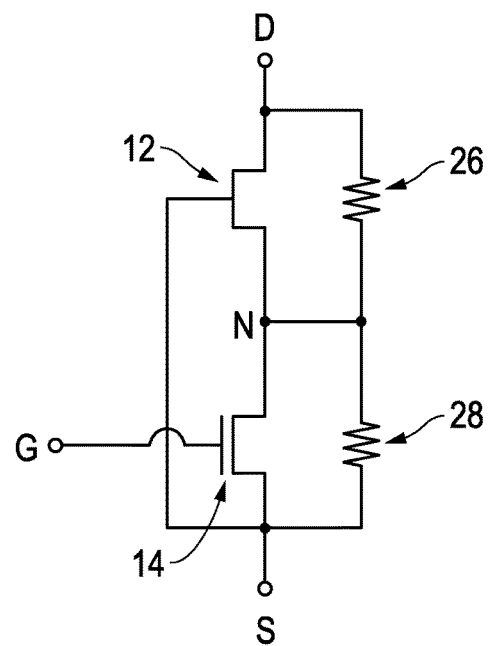
FIG. 2 includes a circuit diagram of transistors connected in a cascode arrangement with resistors connected in parallel with their corresponding transistors.

The component 16 can have terminals coupled to the current electrodes of the transistor 12, and the component 18 can have terminals coupled to the current electrodes of the transistor 14. In an embodiment, the components 16 and 18 can be resistors 26 and 28, as illustrated in FIG. 2. A terminal of the resistor 26 is coupled to the drain of the transistor 12 and the drain terminal of the circuit 10; and the other terminal of the resistor 26 is coupled to the source of the transistor 12, the middle node, and the drain of the transistor 14. A terminal of the resistor 28 is coupled to the drain of the transistor 14, the middle node, and the source of the transistor 12; and the other terminal of the resistor 28 is coupled to the source of the transistor 14, the gate of the transistor 12, and the source terminal of the circuit 10.

Figure 3:
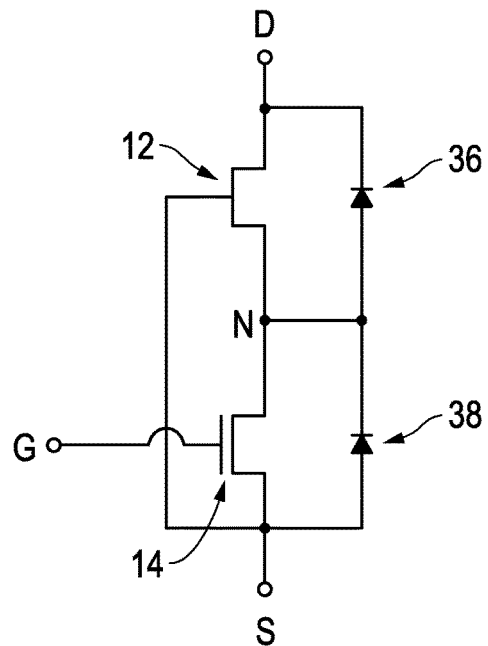
FIG. 3 includes a circuit diagram of transistors connected in a cascode arrangement with diodes connected in parallel with their corresponding transistors.

In another embodiment, the components 16 and 18 can be diodes 36 and 38 as illustrated in FIG. 3. The diodes 36 and 38 may be Schottky diodes or pn junction diodes. A cathode of the diode 36 is coupled to the drain of the transistor 12 and the drain terminal of the circuit 10, and an anode of the diode 36 is coupled to the source of the transistor 12, the middle node, and the drain of the transistor 14. A cathode of the diode 38 is coupled to the drain of the transistor 14, the middle node, and the source of the transistor 12; and an anode of the diode 38 is coupled to the source of the transistor 14, the gate of the transistor 12, and the source terminal of the circuit 10.

In a non-limiting example, the components 16 and 18 can be selected so that the voltage on the gate electrode of the transistor 12 does not get too high during normal operation, which includes switching operations. Normal operation does not include having a voltage difference between the terminals D and S that is higher than designed (e.g., having a 1000 V difference between D and S for a circuit that is designed for no more than 440 V between D and S). In a particular embodiment, the drain-to-source breakdown voltage for the transistor 14 may be in a range of 30 V to 40 V, and thus, gate electrode of the transistor 12 may reach 30 V to 40 V. In an embodiment, the voltage on the gate electrode may be lowered to 20 V and possibly lower. Further, the effective resistance for each of the components 16 and 18 can be over 0.1 MΩ. The components can be a voltage divider, so that voltage designed for the middle node when the transistors 12 and 14 are off is determined by the relative effective resistances of the components. For example, if the voltage at the middle node is to be 10% of the difference between D and S terminals for the circuit, the effective resistance of the component 16 is 9 times higher than an effective resistance of the component 18. The ratio of the effective resistances can be changed as the designed voltage difference between D and S changes. Thus, after reading this specification, skilled artisans will be able to select effective resistances of the components 16 and 18 to meet the needs or desires for a particular application.

All of the previously described couplings can be in the form of electrical connections between the described components.

The components 16 and 18, whether resistors 26 or 28 or diodes 36 and 38, can help reduce the stress on the gate electrode of the transistor 12, reduce the likelihood of current collapse, and provide low $R_{DSON}$. In particular, the component 18 can provide a leakage path around the transistor 14 to help reduce the peak voltage at the gate electrode of the transistor 12. The component 16 can help to keep the $R_{DSON}$ relatively low. When the component 18 is present without the component 16, $R_{DSON}$ can be 200% higher than $R_{DSON}$ in a circuit without components 16 and 18. However, when the components 16 and 18 are present, $R_{DSON}$ can be less than 150% higher, less than 90% higher, and 50% than $R_{DSON}$ in a circuit without components 16 and 18. In an embodiment, when the components 16 and 18 are present, $R_{DSON}$ can be greater than 0.1% higher than $R_{DSON}$ in a circuit without components 16 and 18, and in a particular embodiment, $R_{DSON}$ is about 20% higher than $R_{DSON}$ in a circuit without components 16 and 18. Thus, the circuit strikes a good balance between $R_{DSON}$ and reducing the likelihood of gate stress and current collapse.

The transistors 12 and 14 can be implemented on the same or different dies. The components 16 and 18 may be implemented as discrete components or one or both may be integrated with the transistor 12. Embodiments illustrated and described below provide exemplary embodiments regarding integrated circuits that include the component 18 on the same die as the transistor 12 or both components 16 and 18 on the same die as the transistor 12. Note that in some embodiments below, use of the component 16 within the circuit is not required.

Figure 4:
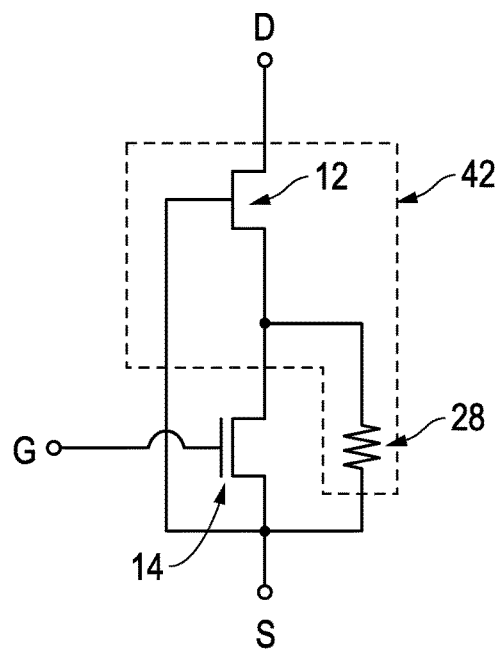
FIG. 4 includes a circuit diagram of transistors connected in a cascode arrangement with a resistor, wherein an integrated circuit includes one of the transistors and the resistor.
Figure 5:
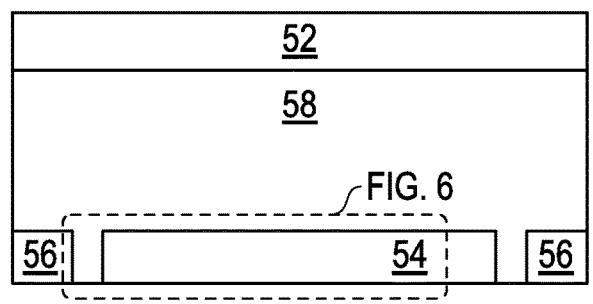
FIG. 5 includes an illustration of a top view of an exemplary physical layout of the integrated circuit of FIG. 4.

In a set of embodiments, the components are resistors. In an embodiment as illustrated in FIG. 4, an integrated circuit 42 can include the transistor 12 and the resistor 28. FIG. 5 includes a physical layout of the integrated circuit 42 that includes a drain pad 52, a source pad 54, and gate pads 56. A transistor area 58 is disposed between the drain pad 52 and the source and gate pads 54 and 56. Many transistor structures are located within the transistor area 58 that form the transistor 12. In particular, the drain electrodes of the transistor structures are connected to the one another and the drain pad 52, the source electrodes of the transistor structures are connected to the one another and the source pad 54, the gate electrodes of the transistor structures are connected to the one another and the gate pad 56. The drain pad 52 is electrically connected to the drain of the circuit 10, the source pad 54 is electrically connected to the middle node of the circuit 10, and the gate pad 56 is electrically connected to the source terminal of the circuit 10 (for example, ground).

Figure 6:
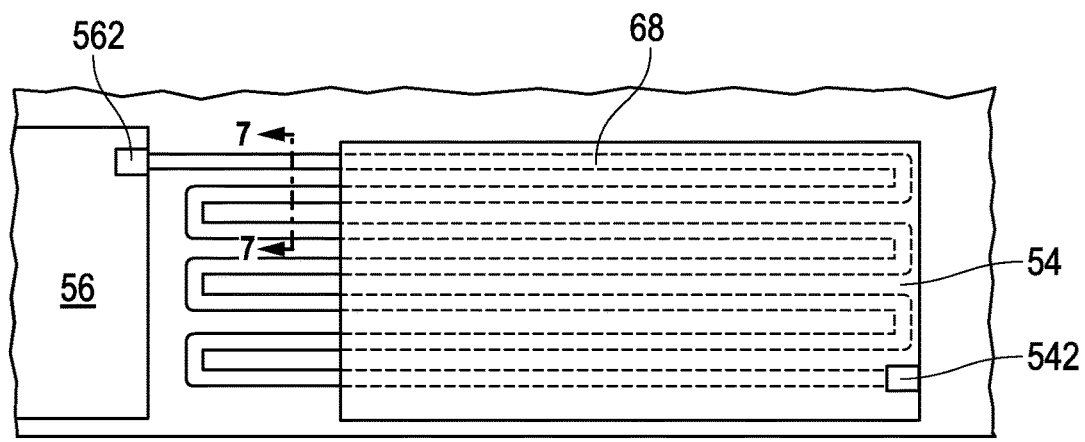
FIG. 6 includes an illustration of a top view of an enlarged portion of the integrated circuit as illustrated in FIG. 5.

FIG. 6 includes an enlarged portion of the integrated circuit to illustrate the location of the resistor with respect to the source and gate pads 54 and 56. In particular, the resistor corresponds to the resistor layout 68 in FIG. 6. The resistor layout 68 has a serpentine pattern. Other patterns for the resistor layout may be used, such as a square wave pattern, a zigzag pattern, a sawtooth pattern, a sinusoidal pattern, or the like. The source pad 54 and gate pad 56 overlie the resistor layout 68 and contact the resistor layout 68 at contacts 562 and 542 that are near the ends of the resistor layout 68.

Figure 7:
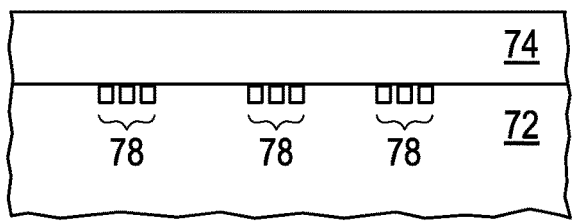
FIGS. 7 and 8 include illustrations of cross-sectional views of portions of the resistor of FIG. 6 in accordance with different embodiments.

FIG. 7 includes an illustration of a cross-sectional view of along sectioning line 7-7 in FIG. 6. The integrated circuit includes many layers, however, only the channel layer 72 and a barrier layer 74 are illustrated. In a particular embodiment, the channel layer 72 can include a GaN layer and is used for the channel regions of the transistor structures that make up the transistor 12, and the barrier layer 74 can include an $Al_{(1-x)}Ga_xN$ layer, where $0<x<1$. FIG. 7 illustrates resistor segments 78 of the resistor layout 68 where a 2DEG will be formed. Ion implantation can be used to define the resistor layout 68. In a particular embodiment, an ionic species can be implanted into channel layer 72 where the 2DEG is not to be formed. In an embodiment, the species can include a noble gas, such as Ar, He, Ne, or the like.

Figure 8:
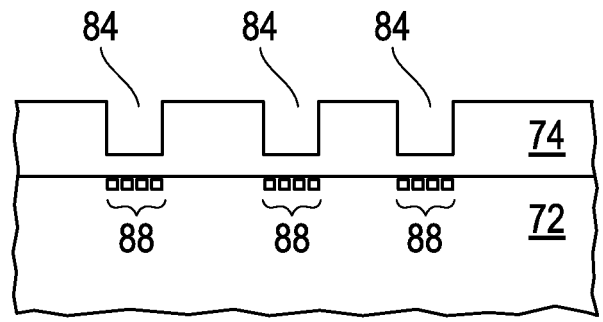
Figure 9:
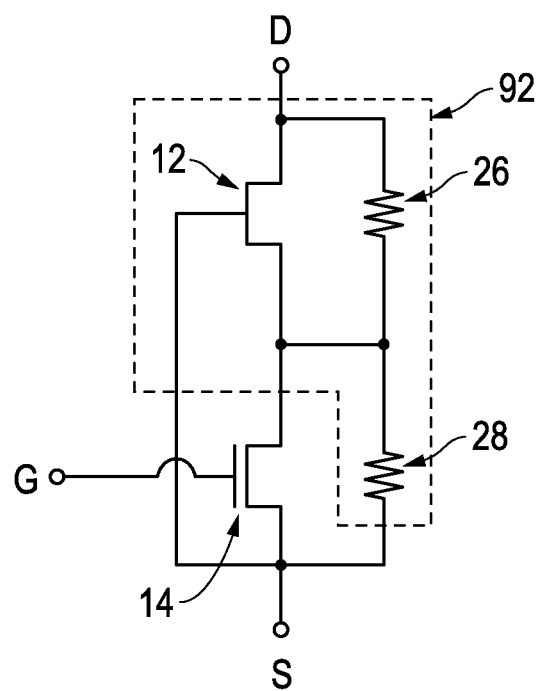
FIG. 9 includes a circuit diagram of transistors connected in a cascode arrangement with resistors connected in parallel with their corresponding transistors, wherein an integrated circuit includes one of the transistors and the resistors.

FIG. 8 includes an illustration of an alternative embodiment that has resistor segments 88. FIG. 8 is similar to FIG. 7 except that portions of the barrier layer 74 are removed. The configuration as illustrated in FIG. 8 allows for higher sheet resistance, and therefore, allows for a more compact resistor layout to be formed.

Figure 10:
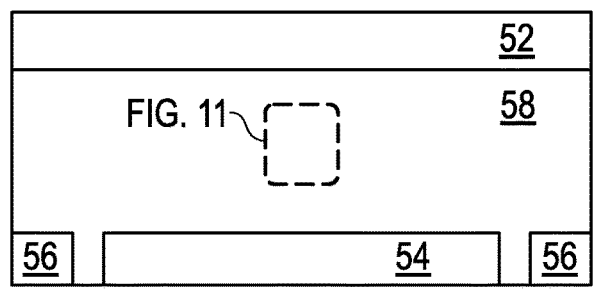
FIG. 10 includes an illustration of a top view of an exemplary physical layout of the integrated circuit of FIG. 9.
Figure 11:
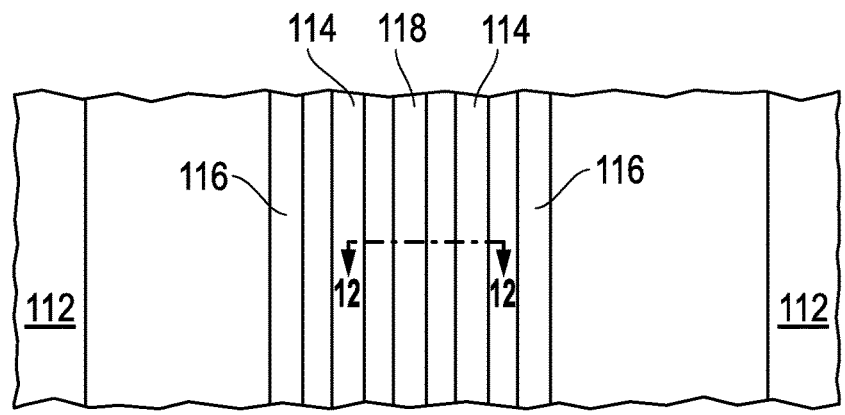
FIG. 11 includes an illustration of a top view of an enlarged portion of the integrated circuit as illustrated in FIG. 10.
Figure 12:
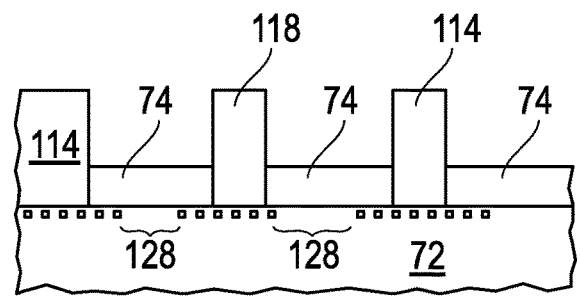
FIG. 12 includes an illustration of a cross-sectional view of portions of the transistor structures and resistors of FIG. 11.

FIGS. 9 to 12 illustrate another embodiment in which an integrated circuit 92 includes the transistor 12 and the resistors 26 and 28. Either of the resistors 26 or 28 can include the resistor layout 68 as previously described. The other resistor can have a layout as illustrated in FIGS. 10 to 12. The other resistor is embedded within the transistor area 58. FIG. 11 includes an enlarged view of a portion of the transistor area 58 and includes two immediately adjacent transistor structures. Each of the transistor structures includes a drain electrode 112, a source electrode 114, and a gate electrode 116 disposed between the drain electrode 112 and the source electrode 114. Another electrode 118 is disposed between the source electrodes 114, and resistors are formed between the source electrodes 114 and the electrode 118. If the resistors correspond to the resistor 28, the electrode 118 is coupled to the gate electrodes 116, and if the resistors correspond to the resistor 26, the electrode 118 is coupled to the drain electrodes 112.

FIG. 12 includes an illustration of a cross-sectional view along sectioning line 12-12 in FIG. 11. FIG. 12 illustrates resistor segments 128 of the between regions where a 2DEG will be formed during operation. Ion implantation can be used to define the resistor segments 128. In a particular embodiment, an ionic species can be implanted into channel layer 122 except where the 2DEG is not to be formed. In an embodiment, the species can include a noble gas, such as Ar, He, Ne, or the like. Thus, in this embodiment, the resistors are formed where the 2DEG is not formed.

Note that in an alternative embodiment, the resistor 28 of integrated circuit 42 (FIG. 4) may be formed within the transistor area 58, just like the resistor 26 of integrated circuit 92 (FIG. 9), rather than near the source and gate pads 54 and 56.

Figure 13:
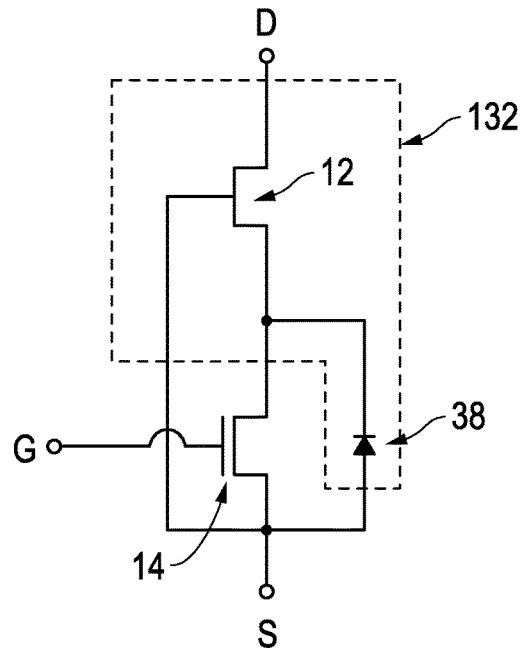
FIG. 13 includes a circuit diagram of a transistors connected in a cascode arrangement with a diode connected in parallel with their corresponding transistors, wherein an integrated circuit includes one of the transistors and the diode.
Figure 14:
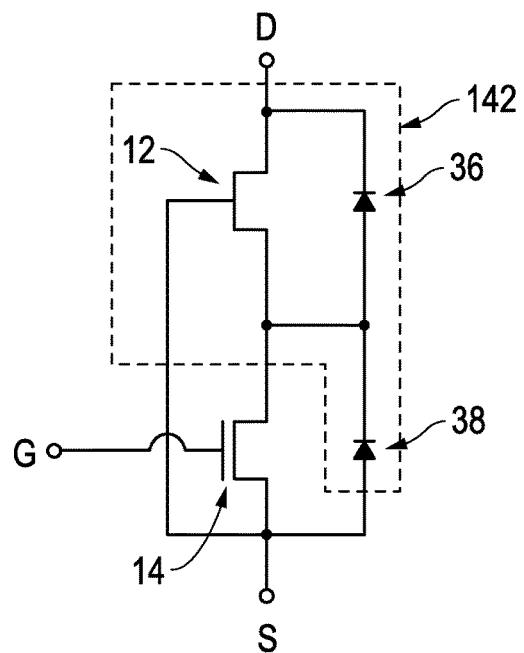
FIG. 14 includes a circuit diagram of transistors connected in a cascode arrangement with diodes connected in parallel with their corresponding transistors, wherein an integrated circuit includes one of the transistors and the diodes.
Figure 15:
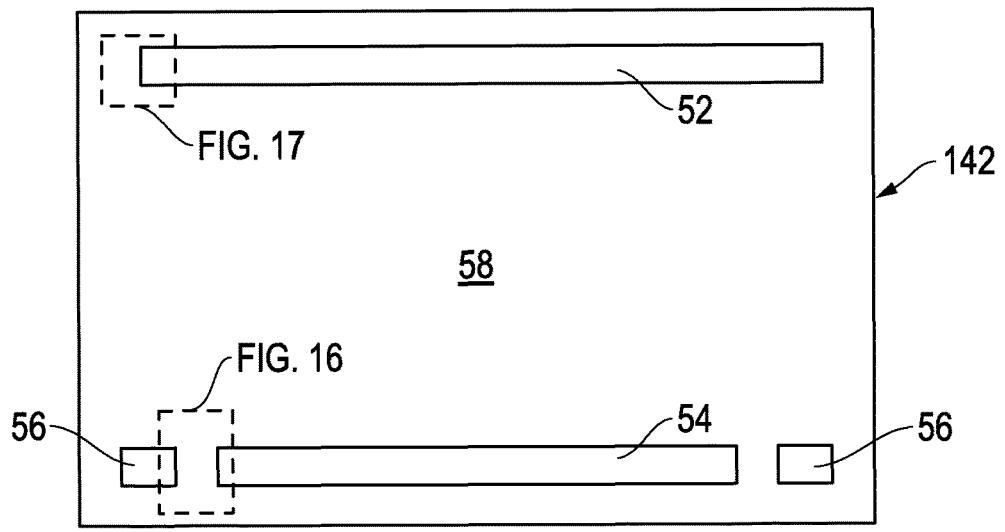
FIG. 15 includes an illustration of a top view of an exemplary physical layout of the integrated circuit of FIG. 14.

In a set of embodiments, the components are diodes. In an embodiment as illustrated in FIG. 13, an integrated circuit 132 can include the transistor 12 and the diode 38. FIG. 14 illustrates another embodiment in which an integrated circuit 142 includes the transistor 12 and the diodes 36 and 38. FIG. 15 includes a physical layout of the integrated circuit 142 that includes the drain pad 52, the source pad 54, and the gate pads 56. The transistor area 58 is disposed between the drain pad 52 and the source and gate pads 54 and 56.

Figure 16:
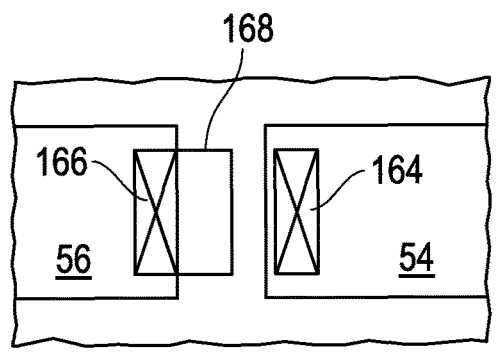
FIGS. 16 and 17 include illustrations of top view of enlarged portions of the integrated circuit of FIG. 15.

FIG. 16 includes an enlarged portion of the integrated circuit 142 when the diode 38 is located between the gate pad 56 and the source pad 54. In an embodiment, the diode is a Schottky diode. The gate pad 56 includes a contact 166 that extends to an anode electrode 168 that extends into the barrier layer 74 and may or may not contact the channel layer 72 (see FIG. 7). The interface between the anode electrode 168 and barrier layer 74 or the channel layer 72 can form the Schottky diode. The cathode of the Schottky diode is coupled to a contact 164 that is part of or electrically connected to the source pad 54.

Figure 17:
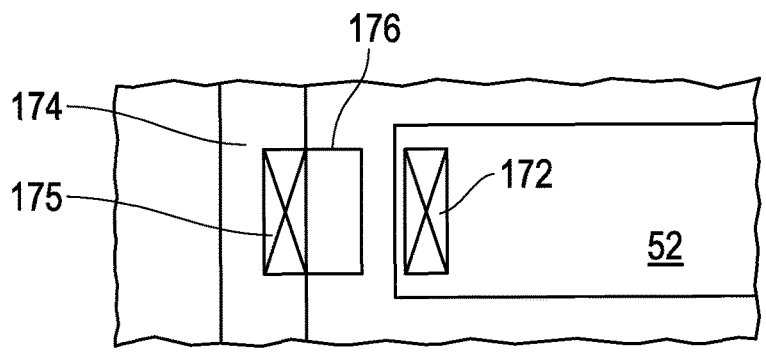

FIG. 17 includes an enlarged portion of the integrated circuit 142 when the diode 36 is located between a source bus 174 and the drain pad 52. In an embodiment, the diode is a Schottky diode. The source bus 174 includes a contact 175 that extends to an anode electrode 176 that extends into the barrier layer 74 and may or may not contact the channel layer 72 (see FIG. 7). The interface between the anode electrode 176 and barrier layer 74 or the channel layer 72 can form the Schottky diode. The cathode of the Schottky diode is coupled to a contact 172 that is part of or electrically connected to the drain pad 52.

In the embodiment as illustrated in FIG. 13, the diode between the gate and source pads 54 and 52 as illustrated in FIGS. 15 and 16 would be present, and the diode between the source bus 174 and the drain pad 52 as illustrated in FIGS. 15 and 17 would not be present.

The physical layouts and organizations of integrated circuits as previously described help with understanding of possible locations of particular components, such as diodes and resistors. Such layouts and organizations are exemplary and do not limit the scope of the present invention. Skilled artisans appreciate than other layouts and organizations are possible.

Many different aspects and embodiments are possible. Some of those aspects and embodiments are described below. After reading this specification, skilled artisans will appreciate that those aspects and embodiments are only illustrative and do not limit the scope of the present invention. Embodiments may be in accordance with any one or more of the items as listed below.

Item 1. A circuit including:
  a first transistor including a first current electrode, a second current electrode, and a control electrode, wherein the first transistor is a high electron mobility transistor;
  a second transistor including a first current electrode, a second current electrode, and a control electrode, wherein the first current electrode of the second transistor is coupled to the second current electrode of the first transistor;
  a first component including a first terminal and a second terminal, wherein:
    the first component is a resistor or a diode;
    the first terminal of the first component is coupled to the first current electrode of the first transistor; and
    the second terminal of the first component is coupled to the second current electrode of the first transistor; and
  a second component including a first terminal and a second terminal, wherein:
    the second component is a resistor or a diode;
    the first terminal of the second component is coupled to the first current electrode of the second transistor; and
    the second terminal of the second component is coupled to the second current electrode of the second transistor and the control electrode of the first transistor.

Item 2. The circuit of Item 1, wherein an on-state resistance of the circuit is lower than an on-state resistance of a different circuit that is identical expect that the first component is not present.

Item 3. The circuit of Item 1, wherein each of the first and second components is a resistor.

Item 4. The circuit of Item 3, wherein the first component has a higher resistance as compared to the second component.

Item 5. The circuit of Item 1, wherein each of the first and second components is a diode; the first terminal of the each of the first and second components is a cathode; and the second terminal of the each of the first and second components is an anode.

Item 6. The circuit of Item 1, wherein the first transistor has a larger source-to-drain breakdown voltage as compared to the second transistor.

Item 7. The circuit of Item 1, wherein the first transistor is a depletion mode III-V transistor, and the second transistor is an enhancement mode silicon transistor.

Item 8. An integrated circuit including:
  a first transistor structure including a first current electrode, a second current electrode, and a control electrode, wherein the first transistor is a high electron mobility transistor; and
  a component including a first terminal and a second terminal, wherein:
    the component is a resistor or a diode;
    the first terminal of the component is coupled to the first current electrode or the control electrode of the first transistor structure;
    the second terminal of the component is coupled to the second current electrode of the transistor structure; and
    the component is disposed:
      below a source pad, a gate pad, a drain pad, or any combination thereof; or
      within a transistor area and between a current electrode of the first transistor and another electrode that is not a current or control electrode of the first transistor structure.

Item 9. The integrated circuit of Item 8, wherein the component is a resistor.

Item 10. The integrated circuit of Item 9, wherein the gate pad is electrically connected to the control electrode of the first transistor structure; and the source pad is electrically connected to the second current electrode of the first transistor structure, wherein the component is disposed under the gate pad, the source pad, or a combination thereof.

Item 11. The integrated circuit of Item 10, wherein the component has a first terminal coupled to the control electrode of the first transistor structure.

Item 12. The integrated circuit of Item 9, wherein the component has a serpentine pattern defined by an isolation region.

Item 13. The integrated circuit of Item 9, further including a channel layer and a barrier layer overlying the channel layer, wherein a portion of the barrier layer is removed at a location corresponding to the resistor.

Item 14. The integrated circuit of Item 9, further including a source bus bar, wherein the drain pad is electrically connected to the first current electrode of the first transistor structure; the source bus bar is electrically connected to the second current electrode of the first transistor structure; and the component is disposed under the drain pad.

Item 15. The integrated circuit of Item 9, further including:
  a second transistor structure including a drain electrode, a source electrode, and a gate electrode, wherein the second transistor structure is a high electron mobility transistor structure; and
  another electrode,
  wherein:

the first current electrode of the first transistor structure is a drain electrode, the second current electrode of the first transistor structure is a source electrode, and the control electrode of the first transistor structure is a gate electrode;

the other electrode is disposed between the source electrodes of the first and second transistor structures;

the resistor includes a first resistor and a second resistor that are disposed within the channel layer;

the first resistor is coupled to the other electrode and the source electrode of the first transistor structure; and the second resistor is coupled to the other electrode and the source electrode of the second transistor structure.

Item 16. The integrated circuit of Item 15, wherein the other electrode is electrically connected to the gate electrodes of the first and second transistor structures.

Item 17. The integrated circuit of Item 15, wherein no drain electrode is disposed between the source electrodes of the first and second transistors structures.

Item 18. The integrated circuit of Item 8, wherein the component is a first Schottky diode that includes an anode and a cathode.

Item 19. The integrated circuit of Item 18, wherein the gate pad is electrically connected to the control electrode of the first transistor structure; the source pad is electrically connected to the second current electrode of the first transistor structure; and the first Schottky diode is disposed between the gate pad and the source pad, an anode of the first Schottky diode is coupled to the gate pad, and the cathode of the first Schottky diode is coupled to the source pad.

Item 20. The integrated circuit of Item 18, further including:

a second Schottky diode that includes an anode and a cathode; and a source electrode bus, wherein:

the drain pad is electrically connected to the first current electrode of the first transistor structure, the second Schottky diode is disposed between the drain pad and the source electrode bus, an anode of the second Schottky diode is coupled to the source electrode bus, and the cathode of the second Schottky diode is coupled to the drain pad.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. A circuit comprising:
   a first transistor including a first current electrode, a second current electrode, and a control electrode, wherein the first transistor is a high electron mobility transistor;
   a second transistor including a first current electrode, a second current electrode, and a control electrode, wherein the first current electrode of the second transistor is coupled to the second current electrode of the first transistor;
   a first component including a first terminal and a second terminal, wherein:
      the first component is a resistor or a diode;
      the first terminal of the first component is coupled to the first current electrode of the first transistor; and
      the second terminal of the first component is coupled to the second current electrode of the first transistor; and
   a second component including a first terminal and a second terminal, wherein:
      the second component is a resistor or a diode;
      the first terminal of the second component is coupled to the first current electrode of the second transistor; and
      the second terminal of the second component is coupled to the second current electrode of the second transistor and the control electrode of the first transistor.

2. The circuit of claim 1, wherein an on-state resistance of the circuit is lower than an on-state resistance of a different circuit that is identical expect that the first component is not present.

3. The circuit of claim 1, wherein each of the first and second components is a resistor.

4. The circuit of claim 3, wherein the first component has a higher resistance as compared to the second component.

5. The circuit of claim 1, wherein:
   each of the first and second components is a diode;
   the first terminal of the each of the first and second components is a cathode; and
   the second terminal of the each of the first and second components is an anode.

6. The circuit of claim 1, wherein the first transistor has a larger source-to-drain breakdown voltage as compared to the second transistor.

7. The circuit of claim 1, wherein the first transistor is a depletion mode III-V transistor, and the second transistor is an enhancement mode silicon transistor.

8. An integrated circuit comprising:
   a first transistor structure including a first current electrode, a second current electrode, and a control electrode, wherein the first transistor structure is a high electron mobility transistor; and a component including a first terminal and a second terminal, wherein:

the component is a resistor or a diode;

the first terminal of the component is coupled to the first current electrode or the control electrode of the first transistor structure;

the second terminal of the component is coupled to the second current electrode of the first transistor structure; and the component is disposed:
- below a source pad, a gate pad, a drain pad, or any combination thereof; or
- within a transistor area and between a current electrode of the first transistor structure and another electrode that is not a current or control electrode of the first transistor structure.

9. The integrated circuit of claim 8, wherein the component is a resistor.

10. The integrated circuit of claim 9, wherein:

the gate pad is electrically connected to the control electrode of the first transistor structure; and the source pad is electrically connected to the second current electrode of the first transistor structure, wherein the component is disposed under the gate pad, the source pad, or a combination thereof.

11. The integrated circuit of claim 10, wherein the component has a first terminal coupled to the control electrode of the first transistor structure.

12. The integrated circuit of claim 9, wherein the component has a serpentine pattern defined by an isolation region.

13. The integrated circuit of claim 9, further comprising a channel layer and a barrier layer overlying the channel layer, wherein a portion of the barrier layer is removed at a location corresponding to the resistor.

14. The integrated circuit of claim 9, further comprising a source bus bar, wherein:

the drain pad is electrically connected to the first current electrode of the first transistor structure;

the source bus bar is electrically connected to the second current electrode of the first transistor structure; and the component is disposed under the drain pad.

15. The integrated circuit of claim 9, further comprising:

a second transistor structure including a drain electrode, a source electrode, and a gate electrode, wherein the second transistor structure is a high electron mobility transistor structure; and another electrode, wherein:

the first current electrode of the first transistor structure is a drain electrode, the second current electrode of the first transistor structure is a source electrode, and the control electrode of the first transistor structure is a gate electrode;

the other electrode is disposed between the source electrodes of the first and second transistor structures;

the resistor includes a first resistor and a second resistor that are disposed within the channel layer;

the first resistor is coupled to the other electrode and the source electrode of the first transistor structure; and the second resistor is coupled to the other electrode and the source electrode of the second transistor structure.

16. The integrated circuit of claim 15, wherein the other electrode is electrically connected to the gate electrodes of the first and second transistor structures.

17. The integrated circuit of claim 15, wherein no drain electrode is disposed between the source electrodes of the first and second transistors structures.

18. The integrated circuit of claim 8, wherein the component is a first Schottky diode that includes an anode and a cathode.

19. The integrated circuit of claim 18, wherein:

the gate pad is electrically connected to the control electrode of the first transistor structure;

the source pad is electrically connected to the second current electrode of the first transistor structure; and the first Schottky diode is disposed between the gate pad and the source pad, an anode of the first Schottky diode is coupled to the gate pad, and the cathode of the first Schottky diode is coupled to the source pad.

20. The integrated circuit of claim 18, further comprising:

a second Schottky diode that includes an anode and a cathode; and a source electrode bus, wherein:

the drain pad is electrically connected to the first current electrode of the first transistor structure; and the second Schottky diode is disposed between the drain pad and the source electrode bus, an anode of the second Schottky diode is coupled to the source electrode bus, and the cathode of the second Schottky diode is coupled to the drain pad.

* * * * *